United States Patent
Jang et al.

(10) Patent No.: US 11,223,367 B2
(45) Date of Patent: Jan. 11, 2022

(54) ANALOG-TO-DIGITAL CONVERTING APPARATUSES AND OPERATING METHODS

(71) Applicant: Samsung Electronics Co., Ltd., Suwon-si (KR)

(72) Inventors: Il Hoon Jang, Hwaseong-si (KR); Hyung Dong Roh, Yongin-si (KR); Seung Yeob Baek, Yongin-si (KR); Michael Choi, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/027,874

(22) Filed: Sep. 22, 2020

(65) Prior Publication Data

US 2021/0250040 A1 Aug. 12, 2021

(30) Foreign Application Priority Data

Feb. 6, 2020 (KR) .................. 10-2020-0014420

(51) Int. Cl.
*H03M 3/02* (2006.01)
*H03M 1/12* (2006.01)
(Continued)

(52) U.S. Cl.
CPC ........... *H03M 3/322* (2013.01); *H03M 3/464* (2013.01); *H04B 1/123* (2013.01); *H03F 3/189* (2013.01);
(Continued)

(58) Field of Classification Search
CPC ...... H03M 1/12; H03M 1/1245; H03M 1/164; H03M 1/462; H03M 3/30; H03M 3/49; H03M 3/167; H03M 3/181; H03M 3/322; H03M 3/342; H03M 3/458; H03M 3/464; H03M 3/486; H03M 3/496; H04B 1/0014; H04B 1/16; H04B 1/123; H04B 1/40; H04B 1/3827; H04B 10/40
See application file for complete search history.

(56) References Cited

U.S. PATENT DOCUMENTS

| 6,940,445 B2 | 9/2005 | Kearney |
| 7,248,198 B2 | 7/2007 | Moon |

(Continued)

FOREIGN PATENT DOCUMENTS

KR     10-1774522 B1    9/2017

*Primary Examiner* — Quochien B Vuong
(74) *Attorney, Agent, or Firm* — Myers Bigel, P.A.

(57) ABSTRACT

An analog-to-digital converting apparatus includes a first stage converter which performs a first analog-to-digital conversion on an input analog signal during a first stage period, a second stage converter which receives a first residue from the first stage converter amplified by a first gain and which performs a second analog-to-digital conversion during a second stage period, and a recombination logic circuit which combines a first output signal from the first stage converter and a second output signal from the second stage converter into an output digital signal that corresponds to the input analog signal. The second stage converter generates a second stage feedback signal obtained by amplifying the second output signal by the first gain during a first sub-cycle in the second stage period, and generates a second output signal of a second sub-cycle subsequent to the first sub-cycle based on the second stage feedback signal.

18 Claims, 12 Drawing Sheets

(51) Int. Cl.
*H04B 1/12* (2006.01)
*H03M 3/00* (2006.01)
*H03F 3/189* (2006.01)

(52) U.S. Cl.
CPC .. *H03F 2200/294* (2013.01); *H03F 2200/451* (2013.01)

(56) References Cited

U.S. PATENT DOCUMENTS

| | | |
|---|---|---|
| 7,248,199 B2 | 7/2007 | Asano et al. |
| 7,274,321 B2 * | 9/2007 | Hurrell ................. H03M 1/145 |
| | | 341/155 |
| 8,384,578 B2 * | 2/2013 | Verbruggen .......... H03M 1/201 |
| | | 341/156 |
| 8,659,461 B1 * | 2/2014 | Zhu .................... H03M 1/1019 |
| | | 341/156 |
| 9,059,730 B2 | 6/2015 | Park et al. |
| 9,219,495 B2 * | 12/2015 | Si ......................... H03M 3/322 |
| 9,276,597 B1 * | 3/2016 | Chang ................ H03M 1/1023 |
| 9,654,130 B2 * | 5/2017 | Venca .................... H03M 1/462 |
| 10,250,277 B1 | 4/2019 | Sim et al. |
| 10,554,219 B2 * | 2/2020 | Raman ................. H03M 3/458 |
| 10,608,658 B2 * | 3/2020 | Palm ................... H03M 1/1245 |
| 10,886,933 B1 * | 1/2021 | Ghosh ................... H03M 1/164 |
| 2011/0267211 A1 | 11/2011 | Oshima et al. |
| 2019/0068212 A1 | 2/2019 | Hershberg et al. |

* cited by examiner ated ANALOG-TO-DIGITAL CONVERTING
APPARATUSES AND OPERATING METHODS

CROSS-REFERENCE TO RELATED
APPLICATION

This application claims priority under 35 U.S.C. § 119 to Korean Patent Application No. 10-2020-0014420 filed on Feb. 6, 2020, in the Korean Intellectual Property Office, the disclosure of which is incorporated by reference herein in its entirety.

BACKGROUND

1. Field of the Invention

The present disclosure relates to analog-to-digital converting apparatuses, and more particularly, to analog-to-digital converting apparatuses having high speed and/or high resolution.

2. Description of the Related Art

In many electronic device applications, analog-to-digital converting apparatuses are apparatuses configured to convert analog signals into digital signals, and is an intellectual property (IP) element indispensable to an application. An analog digital converter (ADC) refers to an apparatus which receives an input of a signal having an analog form that represents a continuous value, and converts it into a signal having a digital form (n-bits) that represents a discrete amount of value.

According to some examples, in a precision measurement system, an electronic device includes one or more sensors for measurement, and the sensors generate an analog signal. In order to perform subsequent process using a microcomputer or the like in the precision measurement system, it is necessary to convert an analog value into a digital value. As another example, in a mobile device receiver, an analog signal generated by an antenna is input to the analog-to-digital converting apparatus, converted into a digital signal, and output.

When a continuous analog signal is converted into a digital signal, an error (quantization error) may occur in quantizing the analog signal.

Factors that measure the performance of the analog-to-digital converting apparatus include a conversion bandwidth and a dynamic range (a signal-to-noise ratio). The bandwidth of the analog-to-digital converting apparatus is primarily specified by a sampling rate thereof, and the dynamic range is affected by factors such as resolution, linearity, and accuracy. The dynamic range of the analog-to-digital converting apparatus may be expressed by its effective number of bits.

SUMMARY

Aspects of the present disclosure provide analog-to-digital converting apparatuses with high accuracy and low power consumption.

Aspects of the present disclosure also provide an analog-to-digital converting apparatuses having high speed and high resolution.

However, aspects of the present disclosure are not restricted those explicitly set forth herein. The above and other aspects of the present disclosure will become more apparent to those of ordinary skill in the art to which the present disclosure pertains by referencing the detailed description of the present inventive concepts given below.

According to some example embodiments of the present disclosure, an analog-to-digital converting apparatus may include a first stage converter configured to perform a first analog-to-digital conversion on an input analog signal during a first stage period and configured to output a first output signal and a first residue, a second stage converter configured to receive the first residue amplified by a first gain; configured to perform a second analog-to-digital conversion during a second stage period; and configured to output a second output signal, and a recombination logic circuit configured to combine the first output signal and the second output signal to output an output digital signal that corresponds to the input analog signal. The second stage converter is configured to generate a second stage feedback signal obtained by amplifying the second output signal by the first gain during a first sub-cycle in the second stage period, and is configured to generate a second output signal of a second sub-cycle subsequent to the first sub-cycle based on the second stage feedback signal.

According to some example embodiments of the present disclosure, a wireless communication device may include a low noise amplifier configured to amplify a radio frequency (RF) signal received through an antenna, a mixer configured to down-convert the amplified RF signal to a baseband frequency range, a low pass filter configured to filter the signal down-converted by the mixer, and analog-to-digital converting apparatus configured to receive an input analog signal from the low pass filter and configured to convert the input analog signal into a output digital signal, and a digital signal processor configured to process the output digital signal.

According to some example embodiments of the present disclosure, an analog-to-digital converting apparatus may include a successive approximation register (SAR) converter configured to perform a first analog-to-digital signal conversion on an input analog signal during a first period and configured to output a first output signal and a first residue, a first transmission circuit configured to amplify the first residue by a first gain, a plurality of delta-sigma (DS) converters each configured to perform a second analog-to-digital conversion based on the amplified first residue and a DS feedback signal during a second period and each configured to generate a second output signal, a plurality of first switches each connected between the first transmission circuit and a respective DS converter of the plurality of DS converters, each first switch configured to be controlled by an enable signal, and each first switch configured to transmit the amplified first residue to the respective DS converter in a time interleaved manner and a recombination logic circuit configured to combine the first output signal and the second output signals generated by the plurality of DS converters to output an output digital signal. Each of the plurality of DS converters includes a second transmission circuit configured to amplify the second output signal by the first gain to generate the DS feedback signal.

According to some example embodiments of the present disclosure, an analog-to-digital converting apparatus may include a plurality of open-loop converters each configured to convert an input analog signal to output a first output signal and a first residue from a first output terminal, a first buffer connected to the first output terminal and configured to buffer the first residue, at least one delta sigma (DS) converter configured to perform a delta-sigma conversion on the buffered first residue and configured to output a second output signal and a DS feedback signal and a recombination logic circuit configured to combine the first output signal and the second output signal into an output digital signal. Each of the at least one DS converters includes a second buffer configured to transmit the second output signal as the DS feedback signal.

According to some example embodiments of the present disclosure, an analog-to-digital converting method may include performing a first analog-to-digital conversion on an input analog signal to generate a first output signal and a first residue signal, first amplifying the first residue by a first gain, transferring, based on an enable signal, the first-amplified first residue, performing a second analog-to-digital conversion based on the first-amplified first residue and s DS feedback signal to generate a second output signal, and combining the first output signal and the second output signal to output an output digital signal. The DS feedback signal may be a signal generated based on second amplifying the second output signal by the first gain.

According to some example embodiments of the present disclosure, an analog-to-digital converting method includes performing, based on an applied sampling signal, a first analog-to-digital conversion on an input analog signal to generate a first output signal and a first residue, amplifying the first residue by a first gain, performing, based on an applied enable signal, a second analog-to-digital conversion on the amplified first residue to generate a second output signal, and combining the first output signal and the second output signal to output an output digital signal, The second output signal may be generated by performing an analog conversion on the second output signal of a first sub-operation cycle, and subtracting a second-amplified first feedback signal from the first residue on the basis of an inverted enable signal, and the second-amplified first feedback signal may be amplified by the first gain.

BRIEF DESCRIPTION OF THE DRAWINGS

The above and other embodiments and features of the present disclosure will become more apparent by describing in detail examples of embodiments thereof with reference to the attached drawings, in which.

DETAILED DESCRIPTION

Hereinafter, some example embodiments according to the present inventive concepts will be described with reference to the drawings.

The present disclosure, but not necessarily the inventive concepts, assumes that a digitally converted final output signal DO is K-bit, or K bits in length (where K is a natural number of 1 or more), a first stage performs an analog-to-digital conversion on M bits beginning from a most significant bit (MSB) down, and a second stage performs the analog-to-digital conversion on the remaining bits except the M bits, that is, for N bits from a least significant bit (LSB), where K=M+N. That is, K is larger than M or N, K is a natural number, and M and N are rational numbers of 0 or more.

Figure 1:
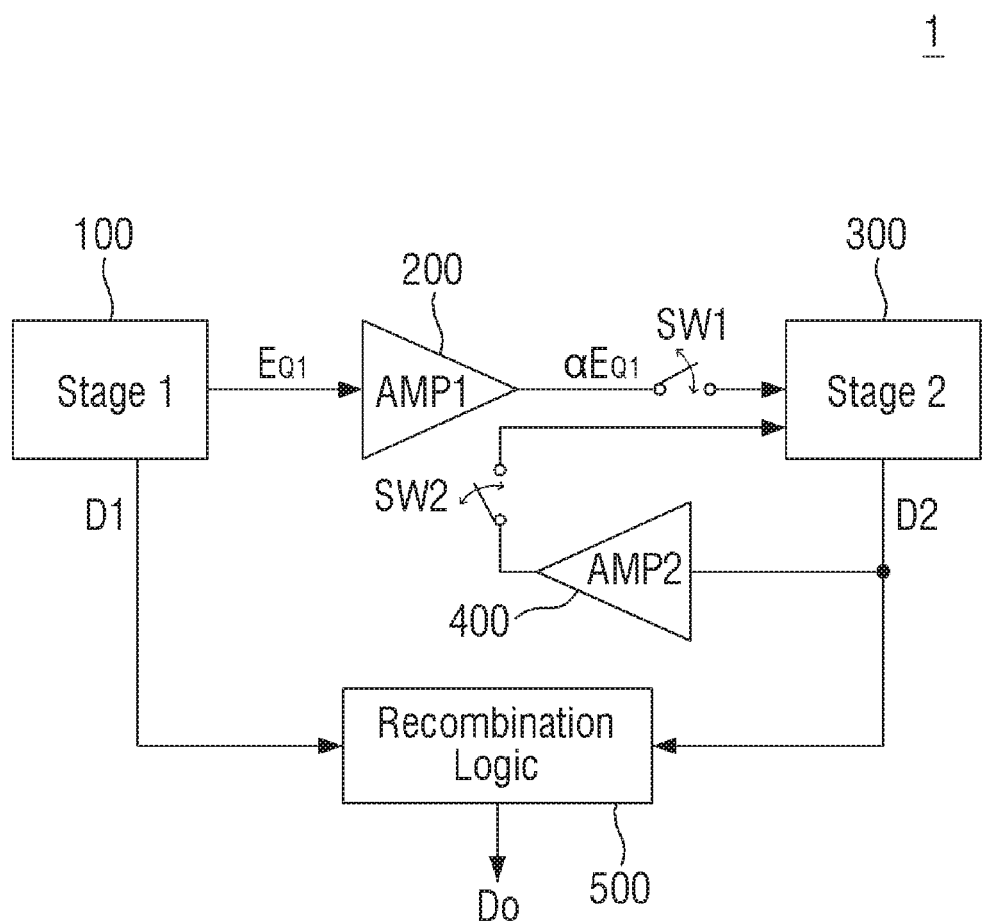
FIG. 1 is a block diagram showing the analog-to-digital converting apparatus according to some example embodiments.
Figure 2:
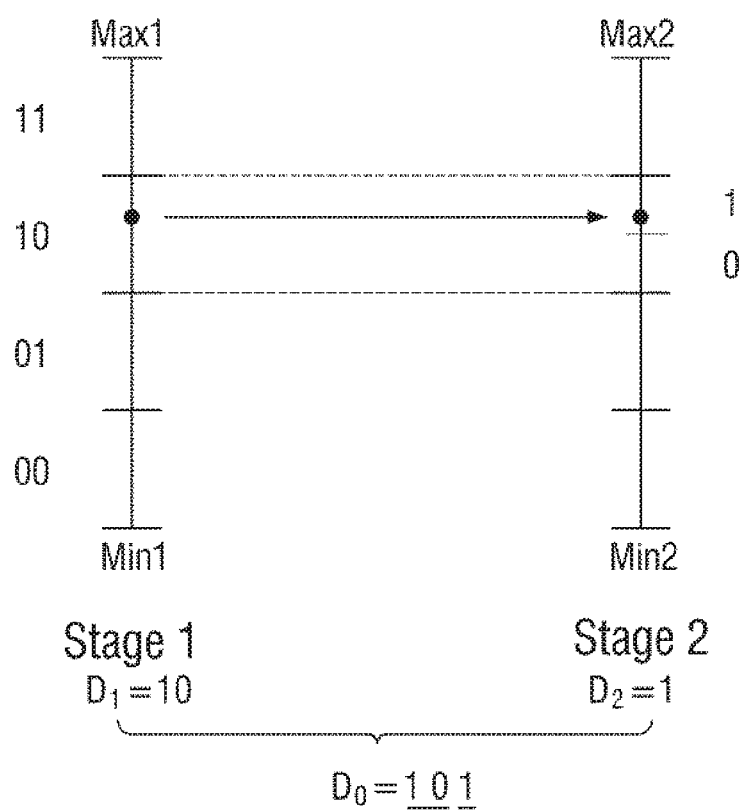
FIG. 2 is a diagram showing an operation of the analog-to-digital converting apparatus according to some example embodiments.
Figure 3:
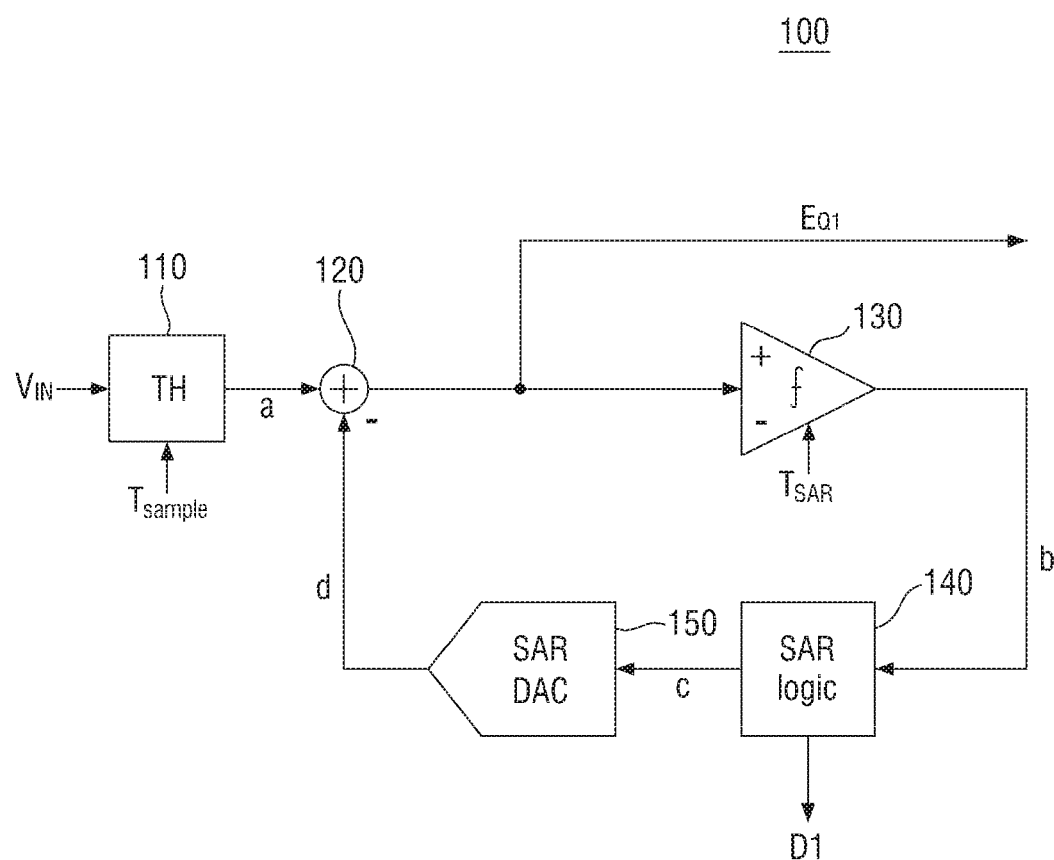
FIG. 3 is a diagram specifically showing the first stage of FIG. 1.
Figure 4:
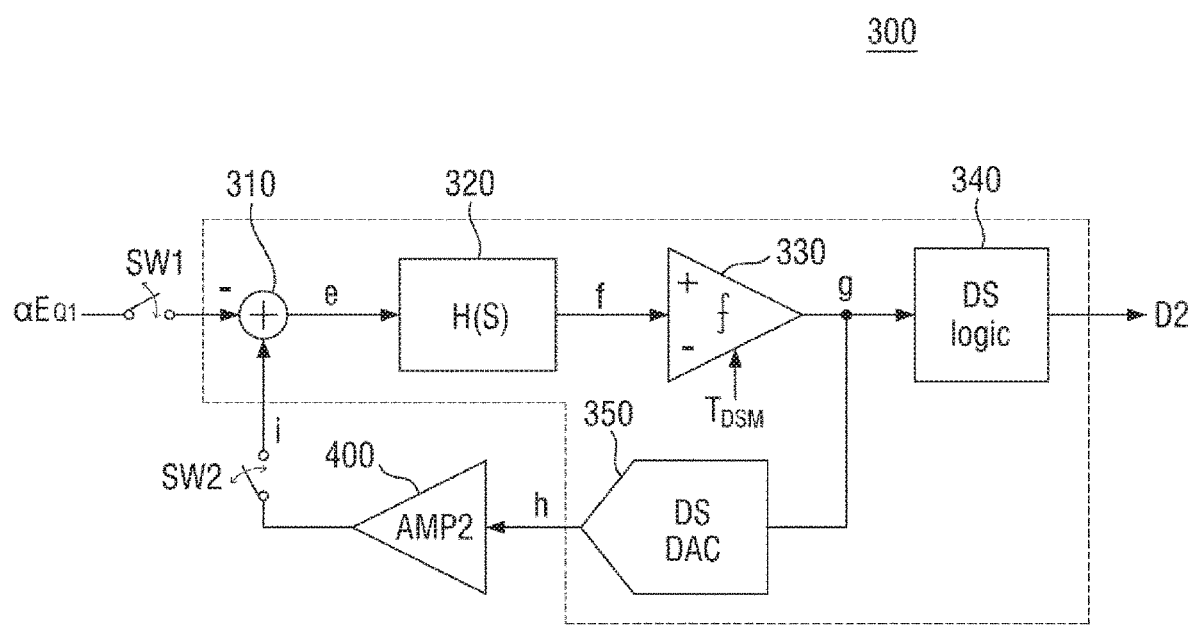
FIG. 4 is a diagram specifically showing a second stage converter of FIG. 1.

FIG. 1 is a block diagram showing the analog-to-digital converting apparatus according to some example embodiments, and FIG. 2 is a diagram showing an operation of the analog-to-digital converting apparatus according to some example embodiments. FIG. 3 is a diagram specifically showing the first stage of FIG. 1, and FIG. 4 is a diagram specifically showing a second stage converter of FIG. 1.

Referring to FIG. 1, an analog-to-digital converting apparatus 1 according to some embodiments may include a first stage converter 100, a first transmission circuit 200, a first switch SW1, a second stage converter 300, a second transmission circuit 400, a second switch SW2, and a recombination logic circuit 500.

The first stage converter 100 may be configured to perform a first analog-to-digital conversion on an input analog signal $V_{IN}$ and may be configured to output both a first output signal D1 and a first residue $E_{Q1}$. The first output signal D1 may be output to the recombination logic circuit 500. The first residue $E_{Q1}$ may be output to the first transmission circuit 200.

The first transmission circuit 200 is configured to amplify and output the first residue $E_{Q1}$ received from the first stage converter 100. The first transmission circuit 200 may amplify the first residue $E_{Q1}$ by a first gain $\alpha$. The first gain $\alpha$ may have a value of 1 according to some example embodiments, and in some example embodiments, the first gain $\alpha$ may have a value greater or smaller than 1. The output of the first transmission circuit 200 may be referred to as an amplified first residue $\alpha E_{Q1}$.

The first switch SW1 is connected the first transmission circuit 200 and the second stage converter 300. Stated differently, a first end of the first switch SW1 may be connected to the first transmission circuit 200 and a second end of the first switch SW1 may be connected to the second stage converter 300. The first switch SW1 is switched according to an enable signal $T_{residue}$ (not shown in FIG. 1). The enable signal $T_{residue}$ may be activated after the operation of the first stage converter 100 is completed or ended and before the second stage converter 200 is started or initiated. That is, the enable signal $T_{residue}$ may be a signal for starting the operation of the second stage converter 300.

The second stage converter 300 is connected between the second end of the first switch SW1 and the recombination logic circuit 500, and may be configured to receive the amplified first residue $\alpha E_{Q1}$ as shown in FIG. 1 from the first transmission circuit 200 via the first switch SW1. The second stage converter 300 may be configured to perform a second analog-to-digital signal conversion on the amplified first residue $\alpha E_{Q1}$, and output the result of the second analog-to-digital conversion to the recombination logic circuit 500 as a second output signal D2. In addition, the second stage converter 300 is configured to output the second output signal D2 to a second transmission circuit 400.

The second transmission circuit 400 is connected between the second stage converter 300 and the second switch SW2, and is configured to amplify the received second output signal D2 by a second gain and output the amplified signal to the second switch SW2. In some example embodiments, the second gain may have the same value as the first gain $\alpha$, but the present disclosure is not limited thereto. According to some example embodiments, the second transmission circuit 400 may be a replica circuit or copy of the first transmission circuit 200. An input terminal and an output terminal of the second transmission circuit 400 may be connected to different nodes of the second stage converter 300. The signal amplified by the second transmission circuit 400 may be input to the second stage converter 300 as a feedback signal via the second switch SW2.

The recombination logic circuit 500 may combine the first output signal D1 and the second output signal D2 to generate an output digital signal $D_O$.

According to some example embodiments, the first stage converter 100 may be an open-loop converter, and the second stage converter 300 may be a closed-loop converter.

Although using an open-loop converter may reduce overall power consumption, since an accuracy of the gain may be degraded in a residue amplification circuit, additional or another calibration may be required. On the other hand, since the closed-loop converter has a feedback structure, it may exhibit increased accuracy while adjusting a ratio of sampling capacitance and feedback capacitance. However, closed-loop converters may draw considerable power consumption in high-speed applications, and the processing speed may be slow, and may be slow to the point of unacceptability.

The analog-to-digital converting apparatus 1 shown in FIG. 1 may be implemented as a pipeline structure. That is, the analog-to-digital converting apparatus 1 may be arranged such that, after the first stage converter 100 performs the first analog-to-digital conversion during a first stage period $T_{SAR}$, the second stage converter 300 may perform the second analog-to-digital conversion during a second stage period $T_{DSM}$ on the basis of the output of the first stage converter 100. The first stage converter 100 and the second stage converter 300 may perform the first analog-to-digital conversion and the second analog-to-digital conversion, respectively, according to each sub-operation cycle. Hereinafter, a sub-operation cycle $T_{SAR.CONV}$ of the first stage converter 100 may be referred to as a first stage sub-cycle, and a sub-operation cycle $T_{DSM.CONV}$ of the second stage converter 300 may be referred to as a second stage sub-cycle, although in some instances, for convenience of explanation, each sub-cycle may be referred to in other ways.

According to some example embodiments, a previous or forward stage may include at least one open-loop converter, and a subsequent or rear stage may include at least one closed-loop converter. Analog-to-digital converting apparatuses in which the open-loop converter and the closed-loop converter are combined, as described herein, may have increased, higher, or high resolution, and may be capable of processing the input analog signals at increased, higher, or high speed. If there are a plurality of open-loop converters in the previous or forward stage, then according to some example embodiments the open-loop converters may be connected in series with each other. If there are a plurality of closed-loop converters at the subsequent or rear stage, then according to some example embodiments the closed-loop converters may be connected in parallel with each other.

That is, in some example embodiments, the analog-to-digital converting apparatus 1 may include a plurality of stages, and each stage may be configured to amplify and transfer a residue (a residual voltage) remaining after conversion for each stage to the next stage. In some example embodiments the residue may be a quantization error of the stage. A previous stage may be configured to output bits close or closer to the most significant bit (MSB), and a subsequent stage may be configured to output bits close or closer to the least significant bit (LSB).

More specifically, in the example shown in FIG. 2, it is assumed that the analog-to-digital converting apparatus has a 3-bit resolution, the first stage converter (Stage 1) has a 2-bit resolution, and the second stage converter (Stage 2) has a 1-bit resolution. The present disclosure is not limited to this example.

The first stage converter (Stage 1) first divides the entire section into two bits, that is, a total of four ($=2^2$) areas of 00, 01, 10, and 11. The first stage converter then finds a section to which the input analog signal belongs from among the four sections. In the shown example, it is first determined that the input analog signal belongs to 10 ($D_1$), and the residue is transferred so that a more specific value is determined by the second stage converter (Stage 2).

The second stage converter (Stage 2) divides the section corresponding to 10 into one bit, that is, two ($=2^1$) areas of 0 and 1, and, in the example shown, determines the more specific value as 1, according to the region to which the received residue belongs ($D_2$).

Continuing the example of FIG. 2, the recombination logic circuit would then output the digital signal 101 ($D_O$). In some example embodiments, the recombination logic circuit outputs the digital signal ($D_O$) in combination with the input analog signal.

The plurality of stages may operate as shown in FIG. 2, and/or there may be more or fewer bits of digital output signal depending on the resolution of each stage/Again, the example embodiments of the present inventive concepts are not limited to the example shown and described with reference to FIG. 2.

In some example embodiments, the first stage converter 100 may be a successive approximation converter. For example, FIG. 3 describes such an embodiment, in which the first stage converter 100 is implemented as a successive approximation converter. In this first stage converter 100 of FIG. 3, an input analog signal $V_{IN}$ may be applied as an input, analog-to-digital conversion may be performed to output the first output signal D1 and the first residue $E_{Q1}$. The analog-to-digital conversion performed by the first stage converter 100 may be the first analog-to-digital conversion discussed above with reference to FIG. 1.

More specifically, according to some example embodiments, the first stage converter 100 may include a sample-and-hold circuit 110, a comparator 130, a SAR logic circuit 140, and a SAR digital-to-analog converter (DAC) 150. According to some embodiments, the first stage converter 100 may further include a first computing unit 120.

Upon receiving the input analog signal $V_{IN}$, the sample-and-hold circuit 110 may perform sampling according to the sampling frequency fs and may output the held signal. The sample-and-hold circuit 110 may be enabled according to the sampling signal $T_{sample}$.

According to some example embodiments, the first computing unit 120 and the comparator 130 may output the result obtained by comparing the output signal of the sample-and-hold circuit 110 with the value stored in the SAR DAC 150 of previous first stage sub-cycle. that is, the first feedback signal (d). The result obtained by the comparison may be output (b) to the SAR logic circuit 140. In some example embodiments, when the sampling signal is enabled, if the output (a) of the sample-and-hold circuit 110 is greater than the value (d) stored in the SAR DAC 150 at the previous first stage sub-cycle, the SAR logic circuit 140 may perform counting, may convert the counting value into an analog value by the SAR DAC 150 during a sub-cycle within the first stage operating section, and may store it as comparison reference of the next sub-cycle. The first stage converter 100 may repeatedly perform the aforementioned procedure, and when the first stage period ends, the first stage converter 100 may be configured to output the counting result at the end of the first stage period to the recombination logic circuit 500 as the first output signal D1. Further, the first stage converter 100 may be configured to output the result obtained by comparing the output signal (a) at the end of the first stage period with the value stored in the SAR DAC 150 of the first stage sub-cycle immediately before the end to the first residue.

That is, the first stage converter 100 may be configured to combine or calculate the sampled input analog signal (a) and the first feedback signal (d) to output the first output signal D1 and the first residue signal $E_{Q1}$.

The SAR logic circuit 140 may count the output signal (b) of the comparator 130 according to the first stage sub-cycle to generate the first output signal D1. At this time, the first output signal D1 may be a digital signal.

The SAR DAC 150 may convert the first output signal D1 generated by the SAR logic circuit 140 into an analog signal and output it as a first feedback signal (d).

The first stage converter 100 described above explains an example of the SAR converter. The present disclosure is not limited thereto, however, and the first stage converter 100 may use an SAR converter having another structure or another type of open-loop converter other than the SAR type according to various example embodiments.

In some example embodiments, the second stage converter 300 may be a converter based on Delta-Sigma Modulation, i.e., a delta-sigma converter. Delta-sigma converters may have increased, higher, or high resolution through oversampling. Delta-sigma converters may be configured to correct accumulated errors of input data, convert the errors into digital signals, and reflect the converted digital signals on the input data.

The second stage converter 300 shown in FIG. 4 is an example of a delta-sigma converter, and may include a loop filter circuit 320, a quantization circuit 330, a DS logic circuit 340 and a DS DAC 350. The second stage converter 300 may also include a second computing unit.

The second computing unit 310 may combine an amplified second feedback signal (i) and an amplified first residue $\alpha E_{Q1}$, and may output the result (e) to the loop filter circuit 320. The loop filter circuit 320 may filter the received signal (e) and may obtain a sample for correcting the error on the signal (e) obtained first several times to accumulate the error. That is, the loop filter circuit 320 may perform oversampling, that is, sampling a plurality of times to obtain the second output signal D2.

According to some example embodiments, in the loop filter circuit 320, a first residue $\alpha E_{Q1}$ amplified using a function H(s) may be applied as a signal transfer function $$\frac{H(S)}{1+H(S)},$$

and a second residue $E_{Q2}$ of a second stage converter 320 may be applied as noise transfer function $$\frac{1}{1+H(S)}.$$

The quantization circuit 330 digitizes and outputs the accumulated error (g). In some embodiments, the quantization circuit 330 may have a resolution of N-bits (where N is a natural number). The quantization circuit 330 may be implemented as a comparator circuit according to some example embodiments. The quantization circuit 330 may compare the output signal (f) of the loop filter circuit 320 with the second reference voltage $V_{REF}$ and may output an output signal (g) according to the comparison result. Referring to the example shown in FIG. 2, the quantization circuit 330 may compare the output signal (f) with the second reference voltage $V_{REF}$ and may output 1.

The second reference voltage $V_{REF}$ may vary depending on a full-scale input voltage range of the second stage converter 300. That is, a range of a minimum value Min2 and a maximum value Max2 shown in FIG. 2 may be set depending on the second reference voltage $V_{REF}$. According to some example embodiments, the second reference voltage $V_{REF}$ may be the same as the first reference voltage $V_{REF}$ of the first stage converter 100.

The DS logic circuit 340 stores the output signal (g) of the quantization circuit 330, and then outputs a digitized second output signal D2. According to some embodiments, the DS logic circuit 340 may include a low-pass filter LPF and a decimator, and may be configured to filter noise of high-frequency band, thin out excess data obtained by oversampling, and may reduce the data to a desired sampling frequency band.

The DS DAC 350 outputs the second feedback signal (h), which may be obtained by converting the digitally converted output signal (g) of the quantization circuit 330 into an analog signal. The outputted second feedback signal (h) may be output to the second transmission circuit 400.

The second transmission circuit 400 amplifies the second feedback signal (h) by a second gain $\alpha_{DSM}$ according to the inverted enable signal. The second feedback signal (h) amplified by the second gain may be subjected to a subtraction operation with the analog signal for error correction obtained by oversampling, i.e., the first residue $\alpha E_{Q1}$. That is, an error is obtained by the subtraction operation.

Stated differently, the second output signal D2 of the second stage converter 300 may be calculated based at least in part on the second feedback signal (h) obtained by amplifying the second output signal D2 of the previous cycle by the second gain $\alpha_{DSM}$. In some example embodiments, the second gain $\alpha_{DSM}$ is the same as the first gain $\alpha$, but the present disclosure is not limited thereto. The gain will be specifically explained by the following equations.

The second transmission circuit 400 may be an identical or same circuit as the first transmission circuit 200. That is, the second transmission circuit 400 may be a replica circuit of the first transmission circuit. The example of the transmission circuit will be explained in FIGS. 5A to 6B.

The second switch SW2 may be connected between an output terminal of the second transmission circuit 400 and an input terminal of the loop filter circuit 320 (for example, via the second computing unit 310), and may transmit the second feedback signal amplified by the second gain according to the inverted enable signal (/$T_{residue}$) to the loop filter circuit 320. The inverted enable signal (/$T_{residue}$) is a signal opposite to the enable signal, and may be turned on from the start or initiation to the end or completion of the second stage operating section.

Hereinafter, the operation of the analog-to-digital converting apparatus 1 according to some embodiments will be more mathematically described.

When the input analog signal $V_{IN}$ is applied, the first stage converter 100 performs the first analog-to-digital conversion to output a first output signal D1 and a first residue $E_{Q1}$. The first residue $E_{Q1}$ is output to the first transmission circuit 200, and the first output signal D1 is output to the recombination logic circuit 500. The first output signal D1 is a signal including a signal $V_{IN}'$ obtained by digitally converting the input analog signal $V_{IN}$ into M-bits beginning from the MSB of a total of K-bits as shown in equation (1) and the first residue $E_{Q1}$.

$$D1 = V_{IN}' + E_{Q1} \quad \text{Equation (1)}$$

The second stage converter 300 receives the amplified first residue $\alpha E_{Q1}$ through the first switch SW1, and performs a second analog-to-digital conversion to output the result of the conversion as a second output signal D2. The second output signal D2 is a signal obtained by digitally converting the amplified first residue $\alpha E_{Q1}$ as in equation (2) from the LSB to the upper $N^{th}$ bits of a total of K-bits, that is, from $(K-M)^{th}$ bit to the least significant bit (LSB), and includes the amplified first residue $\alpha E_{Q1}$ and second residue $E_{Q2}$. As described previously, K is a natural number larger than M, and K equals the sum of M and N.

$$D2 = \alpha E_{Q1} + E_{Q2} \quad \text{Equation (2)}$$

The recombination logic circuit 500 combines the first output signal D1 and the second output signal D2 and outputs the combined signal as a final output signal $D_O$.

As an example, assuming that the second output signal D2 is a signal on which the second gain $\alpha_D$ is reflected, the final output signal DO may be arranged as in the following equation (3).

$$D_O = D1 + \frac{D2}{\alpha_D} = V_{IN}' + \left(1 - \frac{\alpha}{\alpha_D}\right)E_{Q1} + \frac{E_{Q2}}{\alpha_D} \quad \text{Equation (3)}$$

Referring to equation (3), the final output signal $D_O$ may be added up by reflecting the gain $\alpha_D$ in the digital domain to a second output signal D2 corresponding to the first gain $\alpha$ in the analog domain with the first residue applied for accuracy.

Ideally, in the second stage converter 300, when the coefficient $$\left(1 - \frac{\alpha}{\alpha_D}\right)$$

of the first residue $E_{Q1}$ converges to 0 in equation (3), only the second residue EQ2 may remain.

Therefore, overall performance of the analog-to-digital converting apparatus 1 may be determined based at least in part on identifying an appropriate gain $\alpha$, applying the gain $\alpha$ in the first transmission circuit 200, and transmitting gain $\alpha$ within the given sampling period, taking into account the high-speed environment.

If the same gain $\alpha_{DSM}$ as the gain $\alpha$ in the first transmission circuit 200 is applied to the second output signal D2 in the second stage converter 300 ($\alpha_D = \alpha = \alpha_{DSM}$), a second output signal D2 which offsets the applied first residue $\alpha E_{Q1}$ may be generated.

In this case, the final output signal $D_O$ may be arranged as in the following equation (4).

$$D_o = D1 + D2 = V_{IN}' + \left(1 - \frac{\alpha \cdot H(S)}{1 + \alpha_{DSM} \cdot H(S)}\right)E_{Q1} + \frac{1}{1 + \alpha_{DSM} \cdot H(S)}E_{Q2} \quad \text{Equation (4)}$$

Referring to equation (4), if the transfer function H S has an infinite value, the third quantization error $E_{Q2}$ hardly occurs in the final output signal $D_O$. However, the gain $\alpha$ is reflected on the first residue $E_{Q1}$, and the first residue $E_{Q1}$ may occur in the final output signal $D_O$ by $(1-\alpha)E_{Q1}$. However, if the same gain $\alpha_{DSM}$ as the gain $\alpha$ is applied to the second output signal D2 ($\alpha = \alpha_{DSM}$), it is also possible to remove the first residue $E_{Q1}$ from the final output signal $D_O$ under the condition that the transfer function H(S) has the infinite gain.

The second transmission circuit 400 may have a gain $\alpha_{DSM}$ and amplifies the analog output signal (h) of the second stage converter 300 by the gain $\alpha_{DSM}$ and outputs it to the second computing unit 310 (i), as shown in equation (5).

$$i = \alpha_{DSM} \cdot h \quad \text{Equation (5)}$$

The second computing unit 310 adds up the output signal (i) of the second amplifying unit 360 based on the first residue $E_{Q1}$ of the current cycle and the first residue $E_{Q1}$ of the previous cycle, and outputs it to the filter unit 320 (e), as in equation (6).

$$e = \alpha E_{Q1} + i \quad \text{Equation (6)}$$

Since the second stage converter 300 has the second transmission circuit 400 corresponding to the first transmission circuit 200 in a feedback path, it is possible to remove or mitigate performance limitation factors arising from the first transmission circuit 200. More specifically, when rearranged again, the second output signal D2 is expressed as in equation (7).

$$D2 = -\frac{\alpha \cdot H(s)}{1 + \alpha_{DSM} \cdot H(s)}E_{Q1} + \frac{1}{1 + \alpha_{DSM} \cdot H(s)}E_{Q2} \quad \text{Equation (7)}$$

Referring to equation (7), when the gain $\alpha_{DSM}$ and the gain $\alpha$ are the same ($\alpha = \alpha_{DSM}$) and H(s) is ideally infinite, the coefficients of the first residue $E_{Q1}$ and the second residue $E_{Q2}$ converge to 0, respectively. That is, if the first gain at the output of the first stage is made equal to the second gain at the feedback path in the second stage, such that the analog-to-digital converting apparatus 1 may have resolution having the output digital signal higher than the input analog signal.

Figure 5A:
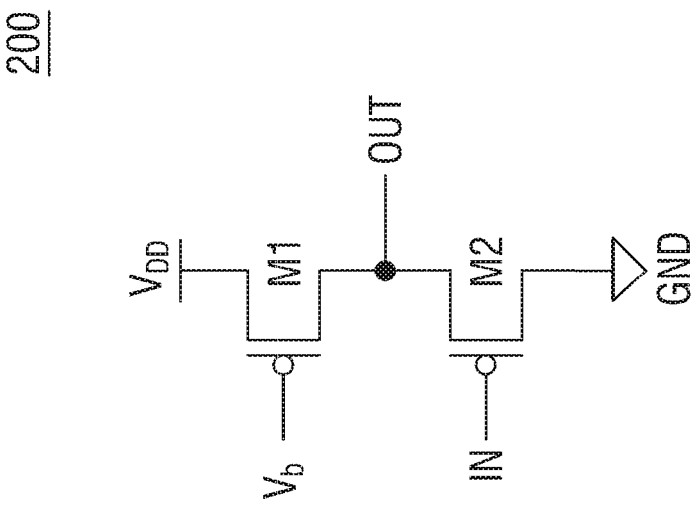
FIGS. 5A and 5B show examples of transmission circuits that may be used to implement a first transmission circuit and a second transmission circuit according to some example embodiments.
Figure 5B:
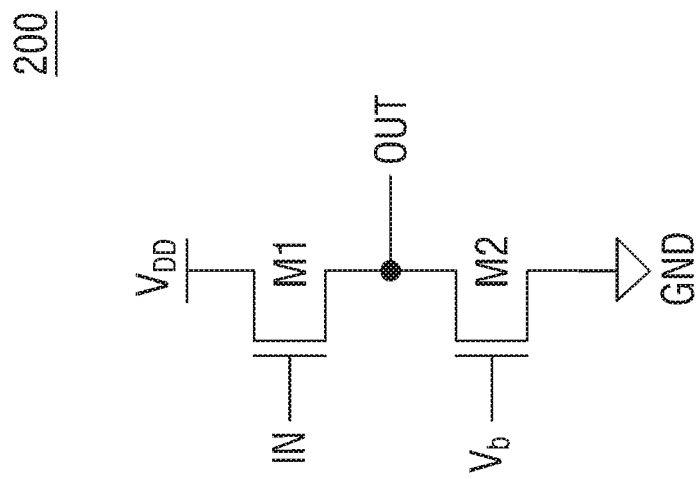

FIGS. 5A and 5B show examples of transmission circuits that may be used to implement the first transmission circuit 200 and the second transmission circuit 400 according to some example embodiments.

Referring to FIG. 5A, the first transmission circuit 200 and the second transmission circuit 400 according to some example embodiments may be NMOS source follower circuits. The NMOS source follower circuits 200 and 400 may include an input transistor M1 and a current source transistor M2 connected in series between a power supply terminal VDD and a ground power supply terminal GND. An input signal IN may be applied to a gate of the transistor M1, and a predetermined bias voltage $V_b$ corresponding to a current source may be applied to a gate of the transistor M2. The output of the NMOS source follower circuits 200 and 400 may be an output voltage OUT between the power supply terminal VDD and the ground power supply terminal GND at the point or node at which one end of the transistor M1 is connected with one end of the transistor M2. When the input signal IN is applied to the gate of the transistor M2 according to the characteristics of the source follower, the signal is output to the source, and the input voltage IN and the output voltage OUT of the NMOS source follower become almost the same. That is, the gain may ideally be 1 (unity) or almost 1 in the real implementation.

Referring to FIG. 5B, the first transmission circuit 200 and the second transmission circuit 400 according to some example embodiments may be PMOS source follower circuits. The PMOS source follower circuits 200 and 400 may include a current source transistor M1 and an input transistor M2 connected in series between the power supply terminal VDD and the ground power supply terminal GND. That is, as compared with the NMOS source follower, the transistors may be connected in reverse order. If the bias voltage is applied to the gate of the current source transistor M1, and the input signal IN is applied to the input transistor M2, the PMOS source follower circuits 200 and 400 may output an output signal OUT. Since explanation of the detailed operation is the same as in FIG. 5A, repeated explanation will not be provided in the interest of brevity.

Figure 6B:
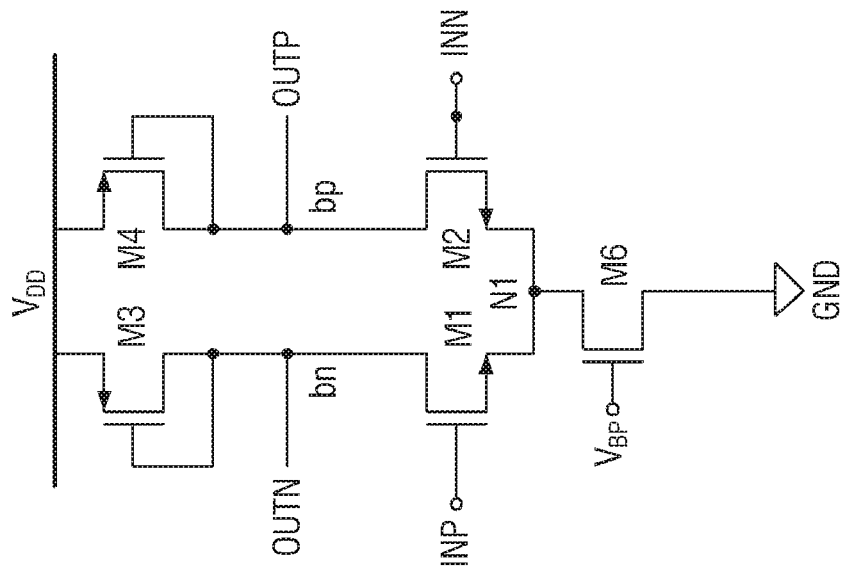
FIGS. 6A and 6B show a first transmission circuit and a second transmission circuit according to some example embodiments.
Figure 6A:
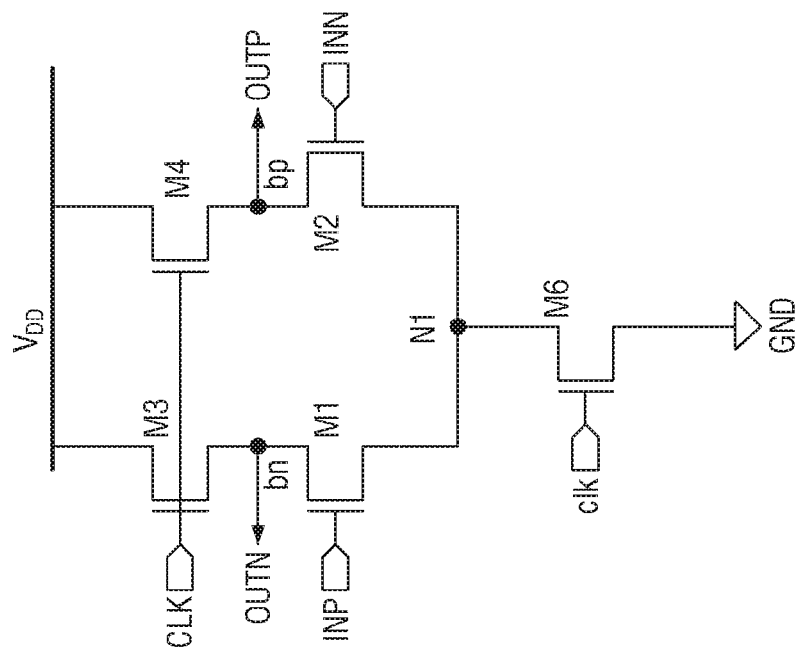

FIGS. 6A and 6B show examples of transmission circuits that may be used to implement the first transmission circuit 200 and the second transmission circuit 400 according to some example embodiments.

The first transmission circuit 200 and the second transmission circuit 400 according to some example embodiments may be a preamp.

Referring to FIG. 6A, a dynamic preamp may be used as some example embodiments of the preamp. In the shown dynamic preamp, a transistor M3 and a transistor M1 are connected in series between the power supply terminal VDD and a node N1. A transistor M4 and a transistor M2 are also connected in series between the power supply terminal VDD and the node M1, and hence the M3/M1 series connection is in parallel with the M4/M2 series connection. A transistor M6 may be connected between the node N1 (i.e., one end of the M1 transistor and one end of the M2 transistor) and the ground power supply terminal GND.

A clock signal CLK is applied to the gates of the M3 transistor, the M4 transistor, and the M6 transistor, and input signals INP, INN of the transmission circuits 200 and 400 may be applied to the gates of the M1 transistor and the M2 transistor. Output signals OUTN, OUTP of the transmission circuits 200 and 400 may be output through output nodes bn, bp between one end of the M3 transistor and the other end of the M1 transistor.

The dynamic preamp transmits the input signals INP, INN to the output signals OUTN, OUTP, while the M3 transistor, the M4 transistor and the M6 transistor are turned on according to the clock signal. Since the M6 transistor of the dynamic preamp is turned on according to the clock signal CK, the current is caused to flow through the dynamic preamp only at the moment of amplification, that is, only when the clock signal is high, and the dynamic preamp dynamically operates. That is, the output signals OUTN, OUTP may buffer the input signals INP, INN according to the settings of the M1 transistor to the M4 transistor and the M6 transistor, and may be amplified with a predetermined gain.

Referring to FIG. 6B, a static preamp may be used as some example embodiments of the preamp. In the shown static preamp, a transistor M3 and a transistor M1 are connected in series between the power supply terminal VDD and a node N1. A transistor M4 and a transistor M2 are also connected in series between the power supply terminal VDD and the node M1, and hence the M3/M1 series connection is in parallel with the M4/M2 series connection. A transistor M6 may be connected between the node N1 (i.e., one end of the M1 transistor and one end of the M2 transistor) and the ground power supply terminal GND.

The output nodes bn, bp are connected to the gates of the M3 transistor and the M4 transistor, and a constant voltage $V_{BP}$ is applied to the gate of the M6 transistor. The input signals INP, INN of the transmission circuits 200 and 400 may be applied to the gates of the M1 transistor and the M2 transistor. The output signals OUTN, OUTP of the transmission circuits 200 and 400 may be output through the output nodes bn, bp between one end of the M3 transistor and the other end of the M1 transistor. Since a constant bias voltage other than a clock signal is applied to the gate of the M6 transistor, a constant current always flows through the static preamp. That is, in a state in which the static preamp is always turned on, the output signals OUTN, OUTP may buffer the input signals INP, INN according to the settings of the M1 transistor to M4 transistor and the M6 transistor, and may be amplified with a predetermined gain.

Figure 7:
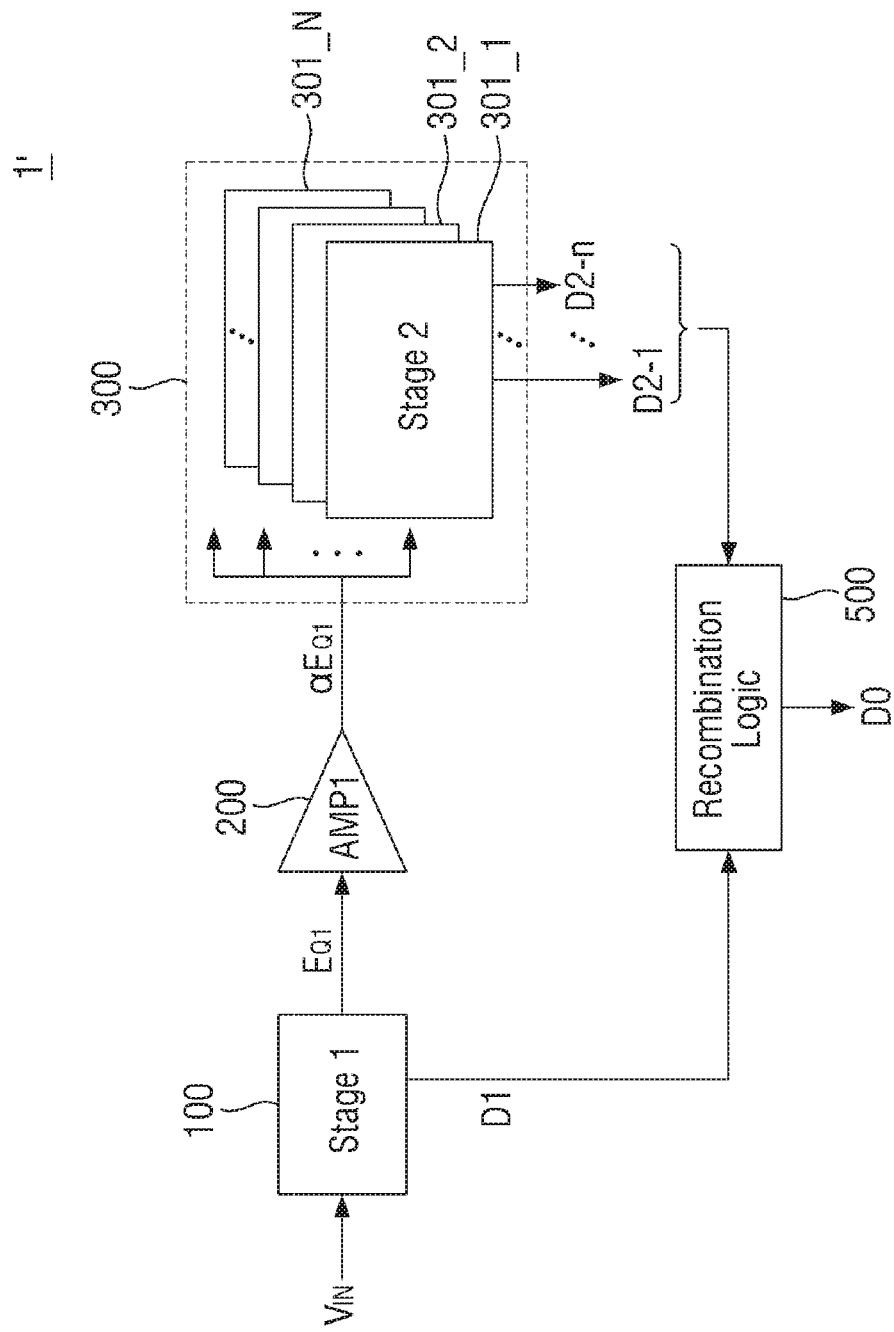
FIG. 7 is a block diagram showing the analog-to-digital converting apparatus according to some example embodiments.

FIG. 7 is a block diagram showing the analog-to-digital converting apparatus according to some example embodiments.

Referring to FIG. 7, an analog-to-digital converting apparatus 1' according to some example embodiments may include a first stage converter 100, a first transmission circuit 200, a plurality of second stage converters 300, and a recombination logic circuit500.

The first stage converter 100 may perform a first analog-to-digital signal conversion on the input analog signal $V_{IN}$ to output a first output signal D1 and a first residue $E_{Q1}$.

The first transmission circuit 200 may amplify and output the first residue $E_{Q1}$ by a first gain α. In some example embodiments, the first gain α may have a value of 1, and in some example embodiments, the first gain α may have a value smaller or greater than 1. The output of the first transmission circuit 200 may be an amplified first residue $\alpha E_{Q1}$.

In the plurality of second stage converters 300, each of the second stage converters 301_1 to 301_N may be connected in parallel between the output terminal of the first transmission circuit 200 and the input terminal of the recombination circuit 500. Each of the second stage converters 301_1 to 301_N may sequentially receive the amplified first residue $\alpha E_{Q1}$ from the first transmission circuit 200 at different timings and may perform a second analog-to-digital conversion. That is, the amplified first residue $\alpha E_{Q1}$ may be received in a time interleaved manner. Although it is not shown, as shown in FIG. 1, a first switch SW1 may be further included between the first transmission circuit 200 and the respective second stage converters 301_1 to 301_N to receive the input in a time interleaved manner, and may receive the amplified first residue $\alpha E_{Q1}$ according to an enable signal $T_{residue}$.

Since each second stage converter 301 operates in a closed-loop and may operate at a lower speed than the first stage converter 100, a plurality of second stage converters 301_1 to 301_N may be connected and operated in the time interleaved manner, depending on desired speed and resolution characteristics for the analog-to-digital converting apparatus 1'.

Each of the second stage converters 301_1 to 301_N receives the input of the amplified first residue $\alpha E_{Q1}$ and may performs the second analog-to-digital conversion to output the second output signal D2 as explained with reference to FIG. 2 and FIG. 4 and the detailed description thereof.

According to some example embodiments, each of the second stage converters 301_1 to 301_N may include a second transmission circuit 400, which may differ from the example embodiments discussed with reference to FIG. 1. Each second transmission circuit 400 may amplify the second output signal D2 by a second gain. According to some embodiments, the second gain may be the same value as the first gain $\alpha$. According to some embodiments, the second transmission circuit 400 may be a replica circuit of the first transmission circuit 200. The input terminal and the output terminal of the second transmission circuit 400 may be connected to different nodes of the second stage converter 300, respectively. The second output signal D2 may be input to the second stage converter 300 as a feedback signal amplified by the second gain.

According to some example embodiments, the first stage converter 100 may be an open-loop converter, and the second stage converter 300 may be a closed-loop converter.

Figure 8:
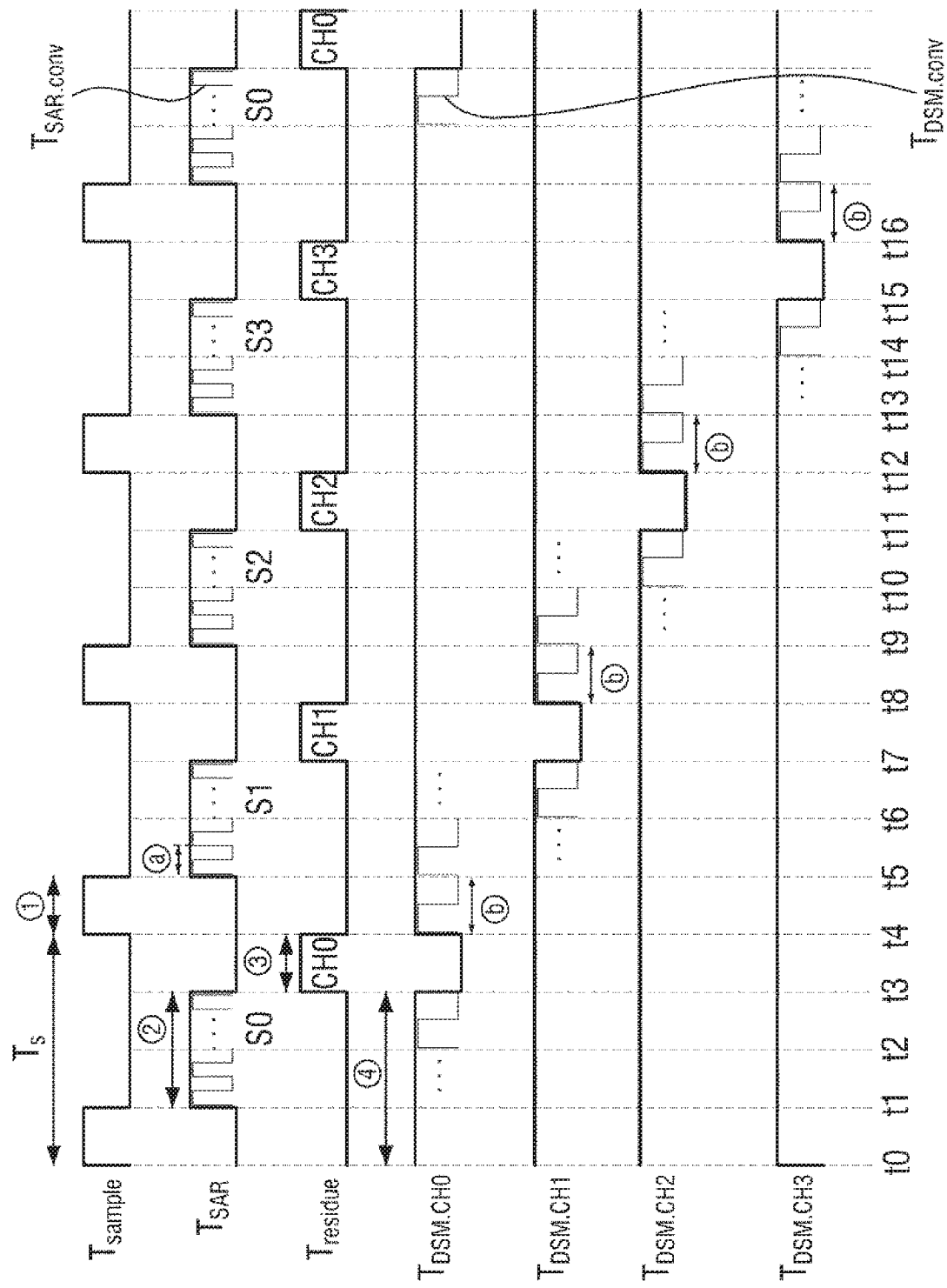
FIG. 8 is a timing chart for explaining an analog-to-digital conversion method according to some example embodiments.

FIG. 8 is a timing chart for explaining an analog-to-digital conversion method according to some example embodiments. An analog-to-digital converting apparatus in which four second stage converters 300 are connected in parallel to one first stage converter 100 will be described as an example, although the present disclosure is not limited thereto.

Referring to FIG. 8, when a sampling signal ($T_{sample}$, ①) is applied to the analog-to-digital converting apparatus, the first stage converter 100 performs the first analog-to-digital conversion during the first stage period ($T_{SAR}$, ②) until the next sampling signal is received ($T_s$). The first analog-to-digital conversion is performed according to the first stage sub-operation cycle ($T_{SAR.conv}$, ⓐ) until the enable signal $T_{residue}$ is applied to the first switch. The enable signal $T_{residue}$ is a signal ③ applied after the first stage operation is completed and before the second stage operation starts, and is a signal for notifying the operation start of the second stage converters.

When the first stage converter performs the first analog-to-digital conversion of S0, the enable signal is applied to the first switch connected to any one second stage converter CH0 of the plurality of second stage converters, which is either not performing a second analog-to-digital conversion operation at the time the enable signal is applied to the first switch, or has just finished the second analog-to-digital conversion operation. The amplified first residue from the first stage converter is transmitted to the second stage converter $T_{DSM.CH0}$ of CH0 connected to the first switch, and the second stage converter starts performing the second analog-to-digital conversion. At this time, during the operation of the second stage converter $T_{DSM.CH0}$ of CH0, the inverted enable signal may be applied to the second switch, and the input signal of the second analog-to-digital conversion continues to be supplied thereto. That is, the inverted enable signal is a signal opposite to the enable signal $T_{residue}$, and may be continuously turned on from t4 which is the time at which $T_{residue}$ CH0 of the time t3 is disabled until the $T_{residue}$ CH0 occurs again.

The second analog-to-digital conversion may be performed, while repeating the second stage sub-cycle ($T_{DSM.conv}$, ⓑ) until the amplified first residue during the second stage period (t4 to t19 in the example shown) becomes a preset resolution, that is, from $(K-M)^{th}$ bit to the least significant bit (LSB).

If the first stage converter performs the first analog-to-digital conversion of S1, the enable signal is applied to the first switch connected to any one second stage converter CH1 among the remaining second stage converters, which is either not performing a second analog-to-digital conversion operation at the time the enable signal is applied to the first switch, or has just finished the second analog-to-digital conversion operation. The amplified first residue from the first stage converter is transmitted to second stage converter $T_{DSM.CH1}$ of CH1 connected to the first switch, which starts performing the second analog-to-digital conversion.

Similarly, the second stage converters $T_{DSM.CH2}$, $T_{DSM.CH3}$ connected to each of CH2 and CH3 also start performing the second analog-to-digital conversion according to the enable signal to be applied to the first switch.

At this time, the enable signal applied to the first switch may be a control signal configured to cause the second stage converters $T_{DSM.CH0}$ to $T_{DSM.CH3}$ connected to each of CH0 to CH3 to perform the time interleaving operation, and thus start the second analog-to-digital conversion at different timings from each other.

Figure 9:
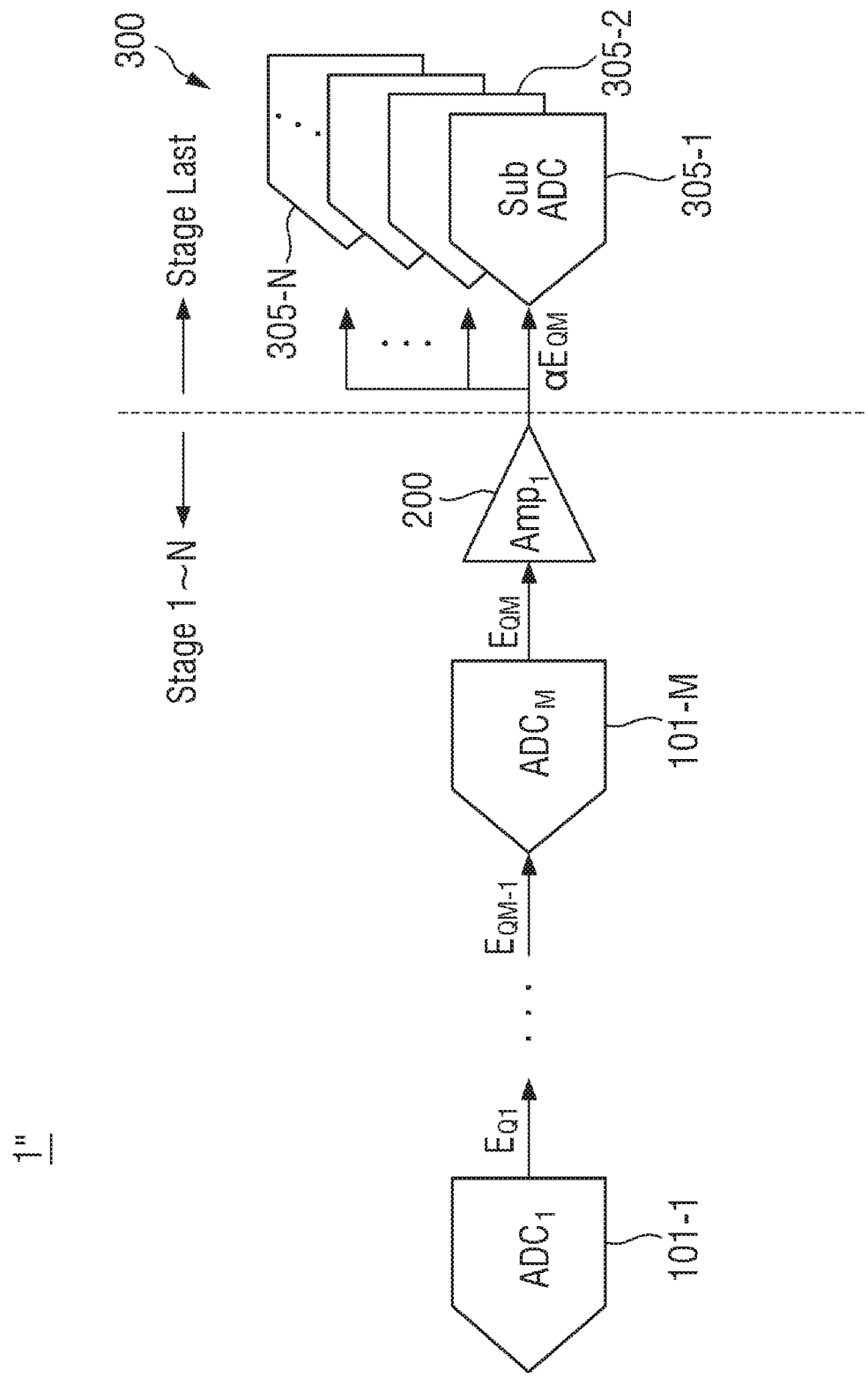
FIG. 9 is a block diagram showing an analog-to-digital converting apparatus according to some example embodiments.

FIG. 9 is a block diagram showing an analog-to-digital converting apparatus according to some example embodiments.

Referring to FIG. 9, the analog-to-digital converting apparatus 1" according to some embodiments may include a plurality of first stage converters 101-1 to 101-M, a single first transmission circuit 200, at least one second stage converter 300 and a recombination logic circuit (not shown in FIG. 9).

Each first stage converter 101-1 to 101-M may perform the first analog-to-digital conversion on the input analog signal $V_{IN}$ to output a first output signal D1 and may output a corresponding first residue $E_{QM}$. For example, a first of the first stage converters 101-1 may output a first residue $E_{Q1}$, a second of the first stage converters 101-2 may output a first residue $E_{Q2}$, and an Mth of the first stage converters 101-M may output the first residue $E_{QM}$. The plurality of first stage converters 100 may be connected in series to increase the resolution while operating faster as an open-loop converter.

The first transmission circuit 200 may amplify and output the first residue $E_{QM}$ by the first gain $\alpha$. In some example embodiments, the first gain $\alpha$ may have a value of 1; in some example embodiments, the first gain $\alpha$ may have a value greater than or smaller than 1. Only one first transmission circuit 200 may be connected to the last stage of the plurality of first stage converters 101-1 to 101-M connected in series, as the first transmission circuit 200 may increase the operation efficiency of the second stage converter 300.

At least one second stage converter 300 may be connected.

When a plurality of second stage converters 300 are connected according to some example embodiments, as in the example embodiments described with reference to FIGS. 7 and 8, each second stage converter 301_1 to 301_N may be connected in parallel between an output terminal of the first transmission circuit 200 and an input terminal of the recombination logic circuit. Each of the second stage converters 301_1 to 301_N may sequentially receive the amplified first residue $\alpha E_{QM}$ from the first transmission circuit 200 at different timings and perform the second analog-to-digital conversion. That is, the amplified first residue $\alpha E_{QM}$ may be received in a time interleaved manner. Although it is not shown, a switch or a transistor may be further included between the first transmission circuit 200 and the respective second stage converters 301_1 to 301_N according to some example embodiments to receive inputs in the time interleaved manner, and may receive the amplified first residue $\alpha E_{QM}$ according to the enable signal.

Each of the second stage converters 301_1 to 301_N receives the input of the amplified first residue $\alpha E_{QM}$ and performs the second analog-to-digital conversion to output the second output signal D2 as explained with reference to FIG. 2 and FIG. 4 and the detailed description thereof. According to some example embodiments, each of the second stage converters 301_1 to 301_N may include a second transmission circuit 400, and as such may differ from the example embodiments described with reference to FIG. 1.

According to some example embodiments, the first stage converter 100 may be an open-loop converter, and the second stage converter 300 may be a closed-loop converter.

Figure 10:
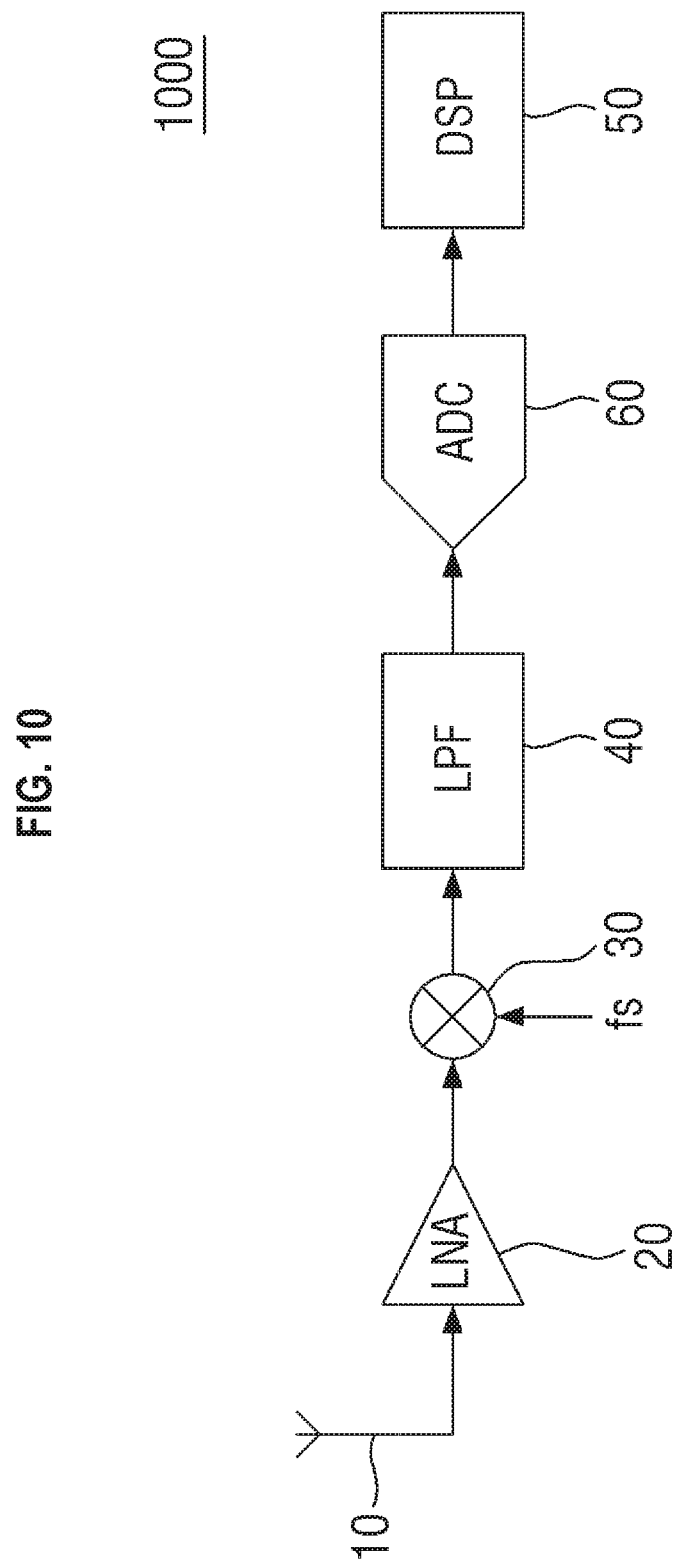
FIG. 10 is a diagram showing a wireless communication device to which the analog-to-digital converting apparatus according to some example embodiments is applied

FIG. 10 is a diagram showing a wireless communication device 1000 to which an analog-to-digital converting apparatus according to some example embodiments is applied. For example, the analog-to-digital converting apparatus may be the analog-to-digital converting apparatus 1 of FIG. 1, the analog-to-digital converting apparatus 1' of FIG. 7, or the analog-to-digital converting apparatus 1" of FIG. 9.

Referring to FIG. 10, the wireless communication device 1000 may include an antenna 10, a low noise amplifier 20, a mixer 30, a low-pass filter 40, an analog-to-digital converting apparatus 60, and a digital signal processor 50.

The low noise amplifier (LNA) 10 may amplify an RF signal received through the antenna 10. The mixer 20 may down-convert the amplified RF signal to the baseband based on a sampling frequency signal fs. The low-pass filter 40 may perform low-pass filtering on the down-converted signal.

The analog-to-digital converting apparatus 60 receives the input analog signal subjected to the low-pass filtering, and converts it into an output digital signal. The analog-to-digital converting apparatus 60 may be the analog-to-digital converting apparatus 1 shown in FIG. 1, the analog-to-digital converting apparatus 1' of FIG. 7, or the analog-to-digital converting apparatus 1" of FIG. 9. According to some embodiments, the input analog signal may be a signal having a frequency of 500 MHz or more. According to some example embodiments, the output digital signal may have a resolution of 10 bits or more.

The digital signal processor 50 may process the output digital signal for use in other applications.

Figure 11:
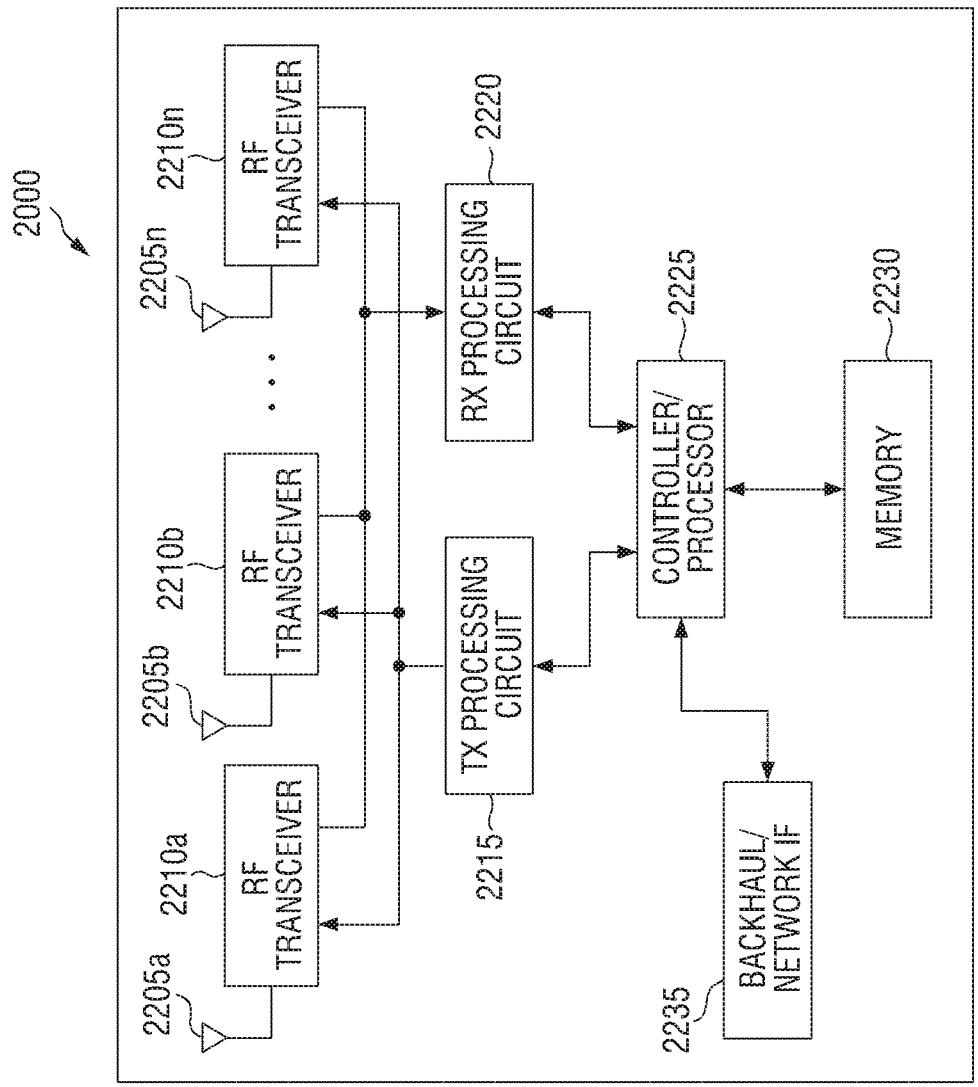
FIG. 11 shows an example of an eNB according to some embodiments.

FIG. 11 shows an example eNB according to some embodiments.

An eNB 2000 provides wireless broadband access to a network for a plurality of user devices UE in a coverage area through a base station. The user device UE may include mobile devices, such as a small business, an enterprise, a WiFi hotspot, a residence, a cell phone, a wireless laptop, and a wireless PDA.

The base station may prove wireless access, according to one or more wireless communication protocols, for example, 5G 3GPP NR (new radio interface/access), LTE (long term evolution), LTE-A (LTE-advanced), high speed packet access (HSPA), Wi-Fi 802.11a/b/g/n/ac, and the like. For convenience, the terms "eNodeB" and "eNB" are used in this disclosure to refer to a network infrastructure component that provides wireless access to a remote terminal.

As shown in FIG. 11, the eNB 2000 includes a number of antennas 2205a to 2205n, a number of RF transceivers 2210a to 2210n, a transmission (transmit, TX) processing circuit 2215 and a reception (receive, RX) processing circuit 2220. The number of antennas and the number of RF transceivers may be large. The eNB 2000 also includes a controller/processor 2225, a memory 2230 and backhaul or network interface 2235.

The RF transceivers 2210a to 2210n receive an incoming RF signal, such as a signal transmitted by an electronic device or user equipment (UE) (not shown) on a network (not shown), from the antennas 2205a to 2205n. The RF transceivers 2210a to 2210n down-convert the incoming RF signal to generate an IF or baseband signal. The IF or baseband signal is transmitted to an RX processing circuit 2220 that generates the baseband signal processed by filtering, decoding, and/or digitizing the baseband or IF signal. The RX processing circuit 2220 transmits the processed baseband signal to a controller/processor 2225 for additional processing. The RF transceivers 2210a to 2210n may include any of the analog-to-digital converting apparatuses disclosed herein, including those according to some example embodiments shown in FIGS. 1 to 10 and described with reference thereto, to convert an analog signal into a digital signal and/or convert a digital signal into an analog signal.

The TX processing circuit 2215 receives analog or digital data (such as voice data, web data, e-mail or interactive video game data) from the controller/processor 2225. The TX processing circuitry 215 encodes, multiplexes and/or digitizes the outgoing baseband data to generate a processed baseband or IF signal. The RF transceivers 2210a to 2210n receive the outgoing processed baseband or IF signal from the TX processing circuit 2215 and up-convert the baseband or IF signal into an RF signal transmitted through the antennas 2205a to 2205n.

The controller/processor 2225 may include one or more processors or other processing devices that control the overall operation of the eNB 2000. For example, the controller/processor 2225 may control the reception of a forward channel signal and the transmission of a reverse channel signal, by the RF transceivers 2210a to 2210n, the RX processing circuit 2220 and the TX processing circuit 2215 according to well-known principles. The controller/processor 2225 may also support additional functions such as more advanced wireless communication functions. For example, the controller/processor 2225 may provide beamforming or directional routing operation (including applying different weights) so that the outgoing signals from the plurality of antennas 2205a to 2205n may be effectively steered in desired directions. A variety of other functions may be supported at the eNB 2000 by the controller/processor 2225.

The controller/processor 2225 may also execute programs and other processes resident in the memory 2230, such as an OS. The controller/processor 2225 may move data into and out of the memory 2230 as required by a running process.

The controller/processor 2225 is also coupled to the backhaul or network interface 2235. The backhaul or network interface 2235 allows the eNB 2000 to communicate with other devices or systems through a backhaul connection or network (not shown in FIG. 11). The interface 2235 may support communication through any suitable wired or wireless connection. For example, when the eNB 2000 is implemented as a part of a cellular communication system (such as supporting 5G, LTE or LTE-A), the interface 2235 may allow the eNB 2000 to communicate with another eNB through a wired or wireless backhaul connection. When the eNB 2000 is implemented as an access point, the interface 2235 may allow the eNB 2000 to communication with a large-scale network through a wired or wireless local area network or a wired or wireless connection (such as the Internet). The interface 2235 includes any suitable structure that supports communication through a wired or wireless connection, such as an Ethernet or RF transceiver.

The memory 2230 is coupled to the controller/processor 2225. A portion of the memory 2230 may include a RAM, and the other portion of the memory 2230 may include a flash memory or another ROM.

Figure 12:
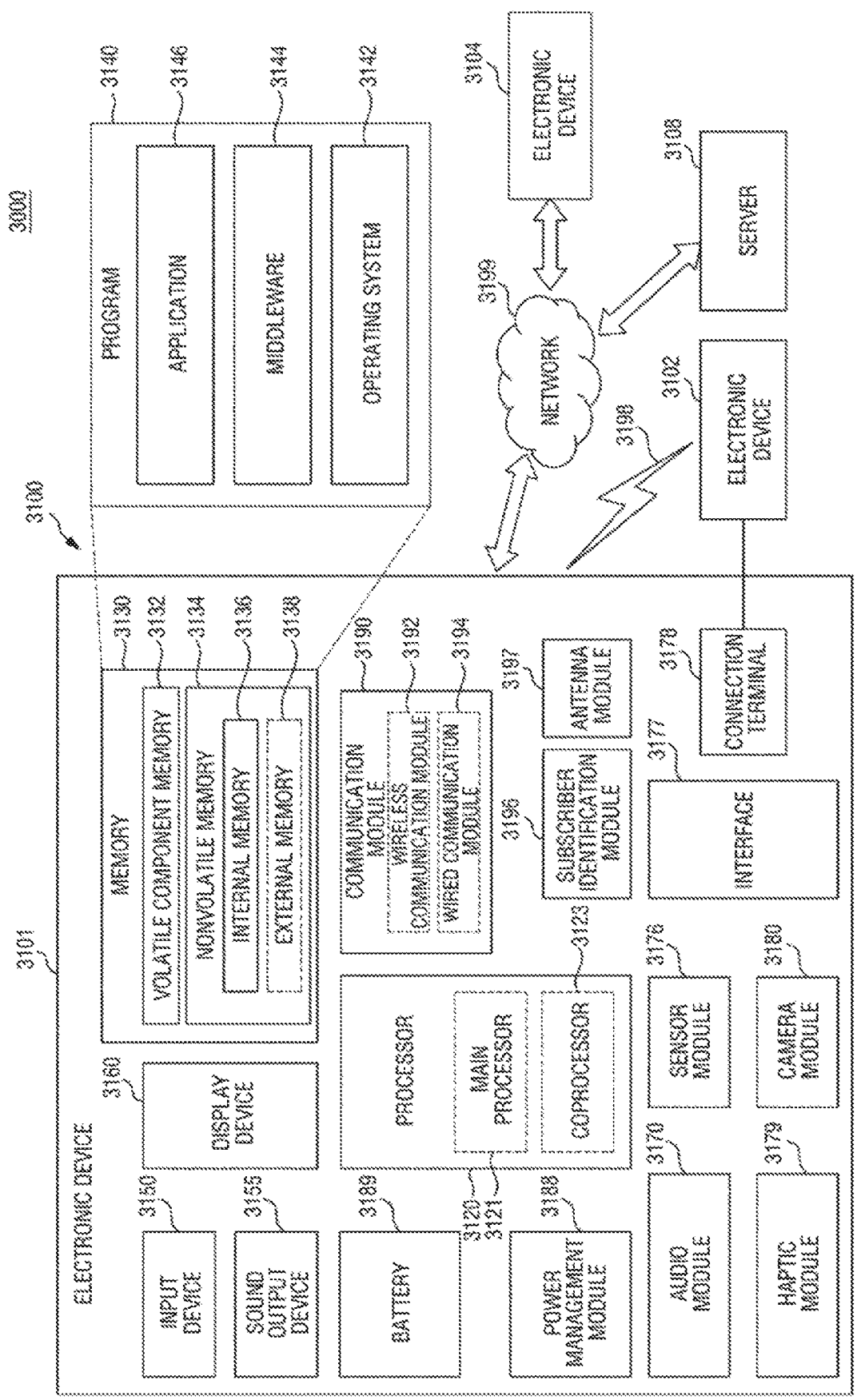
FIG. 12 is a block diagram of an electronic device in a network environment according to some example embodiments.

FIG. 12 is a block diagram of an electronic device in a network environment 3000 according to some embodiments.

Referring to FIG. 12, in the network environment 3000, an electronic device 3101 may communicate with an electronic device 3102 through a first network 3198 (e.g., a short-range wireless communication network), or may communicate with an electronic device 3104 or a server 3108 through a second network 3199 (e.g., a long-range wireless communication network). According to some example embodiments, the electronic device 3101 may communicate with the electronic device 3104 through the server 3108. According to some example embodiments, the electronic device 3101 may include a processor 3120, a memory 3130, an input device 3150, a sound output device 3155, a display device 3160, an audio module 3170, a sensor module 3176, an interface 3177, a connection module 3178, a haptic module 3179, a camera module 3180, a power management module 3188, a battery 3189, a communication module 3190, a subscriber identification module 3196 and/or an antenna module 3197. In some example embodiments, at least one of the constituent elements (e.g., the display device 3160 or the camera module 3180) may be omitted from the electronic device 3101, or one or more other constituent elements may be added. In some example embodiments, some of the constituent elements may be implemented as a single integrated circuit or element. For example, the sensor module 3176 (e.g., a fingerprint sensor, an iris sensor or an illuminance sensor) may be implemented, while being at least partially integrated with the display device 3160 (e.g., a display). For example, the sensor module 3176 may be embedded in the display device 3160.

The processor 3120 may execute, for example, software (e.g., a program 3140) to control at least one other constituent element (e.g., hardware or software constituent element) of the electronic device 3101 connected to the processor 3120, and may execute various data processes and calculations. According to some example embodiments, as at least a part of the data process or calculation, the processor 3120 may load commands or data received from other constituent elements (e.g., a sensor module 3176 or a communication module 3190) to a volatile component memory 3132, process commands or data stored in the volatile memory 3132, and store the result data in the nonvolatile memory 3134. According to some example embodiments, the processor 3120 may include a main processor 3121 (e.g., a central processing unit or an application processor), and a coprocessor 3123 (e.g., a graphics processing unit, an image signal processor, a sensor hub processor or a communication processor) operable independently from and/or together with the main processor 3121. Additionally or alternatively, the coprocessor 3123 may be configured to use lower power consumption than the main processor 3121 and/or may specialize in designated functions. The coprocessor 3123 may be implemented separately from or as a part of the main processor 3121.

The coprocessor 3123 may control, for example, at least some of the functions or states related to at least one constituent element (e.g., the display device 3160, the sensor module 3176 or the communication module 3190) among the constituent elements of the electronic device 3101, in place of the main processor 3121 while the main processor 3121 is in an inactive (e.g., a sleep state) state, or along with the main processor 3121 while the main processor 3121 is in an active (e.g., an application execution) state. According to some example embodiments, the coprocessor 3123 (e.g., an image signal processor or a communication processor) may be implemented as a part of functionally related another constituent element (e.g., a camera module 3180 or a communication module 3190).

The memory 3130 may store various data used by at least one constituent element (e.g., the processor 3120 or the sensor module 3176) of the electronic device 3101. The data may include, for example, software (e.g., one or more programs 3140) and input data or output data of commands associated therewith. The memory 3130 may include a volatile memory 3132 or a nonvolatile memory 3134.

The one or more programs 3140 may be stored as software in the memory 3130, and may include, for example, an operating system 3142, middleware 3144 or an application 3146.

The input device 3150 may receive commands or data to be used by at least one constituent element (e.g., the processor 3120) of the electronic device 3101 from a source (e.g., a user) that is external to the electronic device 3101. The input device 3150 may include, for example, a microphone, a mouse, or a keyboard.

The sound output device 3155 may output a sound signal to the outside of the electronic device 3101. The sound output device 3155 may include, for example, a speaker or a receiver. The speaker may be used for general purposes, such as multimedia playback or recording playback, and the receiver may be used to receive incoming calls. According to some example embodiments, the receiver may be implemented separately from or as a part of the speaker.

The display device 3160 may visually provide information to a destination (e.g., a user) that is external to the electronic device 3101. The display device 3160 may include, for example, a display, a hologram device and/or a projector, and may include a control circuit for controlling the display device 3160. According to some example embodiments, the display device 3160 may include touch circuitry configured to detect a touch, or a sensor circuit (e.g., a pressure sensor) which is set to measure the strength of a force generated by the touch.

The audio module 3170 may convert a sound into an electric signal and/or convert an electrical signal into a sound. According to an embodiment, the audio module 3170 may acquire a sound through the input device 3150 or may output a sound through a sound output device 3155, or an external electronic device (e.g., the electronic device 3102) (e.g., a speaker or a headphone) directly or wirelessly connected to the electronic device 3101.

The sensor module 3176 detects an operation state (e.g., power or temperature) of the electronic device 3101 or an external environment state (e.g., a user state), and may generate an electric signal or data value corresponding to the detected state. According to some example embodiments, the sensor module 3176 may include, for example, a gesture sensor, a gyro sensor, an atmospheric pressure sensor, a magnetic sensor, an acceleration sensor, a grip sensor, a proximity sensor, a color sensor, an IR (infrared) sensor, a biological sensor, a temperature sensor, a humidity sensor or an illuminance sensor.

The interface 3177 may support one or more specified protocols that may be used for the electronic device 3101 to connect to an external electronic device directly or wirelessly (e.g., the electronic device 3102). According to an embodiment, the interface 3177 may include, for example, a high definition multimedia interface (HDMI), a universal serial bus (USB) interface, an SD card interface or an audio interface.

The connection terminal 3178 may include a connector through which the electronic device 3101 may be physically connected to an external electronic device (e.g., the electronic device 3102). According to some example embodiments, the connection terminal 3178 may include, for example, an HDMI connector, a USB connector, an SD card connector or an audio connector (e.g., a headphone connector).

The haptic module 3179 may convert an electrical signal into a mechanical stimulus (e.g., vibration or motion) or an electrical stimulus that may be perceived by a user through tactile or kinesthetic sensations. According to some example embodiments, the haptic module 3179 may include, for example, a motor, a piezoelectric element or an electrical stimulator.

The camera module 3180 may capture a still image or a moving image. According to some example embodiments, the camera module 3180 may include one or more lenses, image sensors, image signal processors or flashes.

The power management module 3188 may manage power to be supplied to the electronic device 3101. According to some example embodiments, the power management module 3188 may be implemented, for example, as at least a part of a power management integrated circuit (PMIC).

The battery 3189 may supply power to at least one constituent element of the electronic device 3101. According to some example embodiments, the battery 3189 may include, for example, a non-rechargeable primary battery, a rechargeable secondary battery or a fuel cell.

The communication module 3190 may support the establishment of a direct (e.g., wired) communication channel or a wireless communication channel between the electronic device 3101 and an external electronic device (e.g., the electronic device 3102, the electronic device 3104 or the server 3108), and may control performance of the communication through the established communication channel. The communication module 3190 may operate independently of the processor 3120 (e.g., an application processor), and may include one or more communication processors that support direct (e.g., wired) or wireless communication. According to some example embodiments, the communication module 3190 may include a wireless communication module 3192 (e.g., a cellular communication module, a short-range wireless communication module or a global navigation satellite system (GNSS) communication module) or a wired communication module 3194 (e.g., a local area network (LAN) communication module or a power line communication module). Each communication module among these communication modules 3192, 3194 may communicate with external electronic devices through a first network 3198 (e.g., a short-range wired and/or wireless communication network such as Bluetooth, WiFi direct or infrared data association (IrDA)) or a second network 3199 (e.g., a long-range wired and/or wireless communication network such as a cellular network, Internet or a computer network (e.g., LAN or WAN)). The several types of communication modules may be integrated into a single constituent element (e.g., a single chip) or may be implemented as a plurality of separate constituent elements (e.g., multiple chips). The wireless communication module 3192 may confirm and authenticate the electronic device 3101 in the communication network such as the first network 3198 or the second network 3199, using the subscriber information (e.g., International Mobile Subscriber Identifier (IMSI) stored in the subscriber identification module 3196)).

The antenna module 3197 may transmit or receive the signal or power to or from the outside (e.g., an external electronic device). According to some example embodiments, the antenna module 3197 may include one or more antennas (not shown), and thus, at least one antenna suitable for the communication scheme used in a communication network such as the first network 3198 or the second network 3199 may be selected, for example, by the communication module 3190. The signal or power may be transmitted or received between the communication module 3190 and the external electronic device through at least one selected antenna. The antenna module 3197 may include one or more analog-to-digital converting apparatuses, including one or more analog-to-digital converting apparatus according to the inventive concepts disclosed herein, some example embodiments of which were described herein with reference to FIGS. 1 to 10.

At least some of the constituent elements are connected to each other through a communication scheme between peripherals (e.g., a bus, general purpose input and output (GPIO), serial peripheral interface (SPI) or mobile industry processor interface (MIPI)), and may exchange signals (e.g., command or data) with each other.

Electronic devices according to various example embodiments disclosed herein may be any of various forms of devices. An electronic device according to the present disclosure may be or may include, for example, a mobile communication device (e.g., a smartphone), a computer device, a portable multimedia device, a portable medical device, a camera, a wearable device or a home appliance. The present document is not limited to the above-described electronic devices.

As used herein, the term "module" may include units implemented as hardware, software and/or firmware, and may be used interchangeably with terms, for example, such as logic, logic blocks, components or circuits. A module may be an integrally configured component or the smallest unit or part of the component that performs one or more functions thereof. For example, according to some example embodiment, a module may be implemented in the form of an application-specific integrated circuit (ASIC).

Various example embodiments described herein may be implemented as software (e.g., a program 3140) that includes one or more commands stored in a storage medium (e.g., an internal memory 3136 or an external memory 3138) that may be read by a machine (e.g., the electronic device 3101). For example, a processor (e.g., the processor 3120) of a machine (e.g., the electronic device 3101) may call and execute at least one of one or more stored commands from the storage medium.

In concluding the detailed description, those skilled in the art will appreciate that many variations and modifications may be made to the preferred embodiments without substantially departing from the principles of the present inventive concepts. Therefore, the disclosed example embodiments of the inventive concepts are used in a generic and descriptive sense only and not for purposes of limitation.

What is claimed is:

1. An analog-to-digital converting apparatus comprising:
a first stage converter configured to perform a first analog-to-digital conversion on an input analog signal during a first stage period, and configured to output a first output signal and a first residue;
a first transmission circuit connected to an output terminal of the first stage converter and configured to output the first residue amplified by a first gain;
a plurality of second stage converters each configured to receive the first residue amplified by the first gain, configured to perform a second analog-to-digital conversion during a second stage period, and configured to output a second output signal;
a plurality of first switches configured to switch according to an enable signal, each of the plurality of the first switches connected to at least two second stage converters of the plurality of second stage converters; and
a recombination logic circuit configured to combine the first output signal and the second output signal, and configured to output an output digital signal that corresponds to the input analog signal,
wherein each second stage converter is configured to generate a second stage feedback signal obtained by amplifying the second output signal by the first gain during a first sub-cycle in the second stage period, and is configured to generate a second output signal of a second sub-cycle subsequent to the first sub-cycle based on the second stage feedback signal, and
wherein the enable signal enables each of the second stage converters in a time interleaved manner.

2. The analog-to-digital converting apparatus of claim 1, wherein each second stage converter comprises:
a second transmission circuit connected between an input terminal of the second stage converter and an output terminal of the second stage converter, and configured to output the second stage feedback signal obtained by amplifying the second output signal by the first gain to the input terminal of the second stage converter; and
a second switch which is turned on according to an inverted enable signal opposite to the enable signal.

3. The analog-to-digital converting apparatus of claim 2, wherein the first transmission circuit and the second transmission circuit each comprise a source follower circuit.

4. The analog-to-digital converting apparatus of claim 1, wherein the enable signal is at an off value during the first stage period and is at an on value when the second stage period starts.

5. The analog-to-digital converting apparatus of claim 1, wherein the first stage converter is a successive approximation register converter (SAR ADC), and wherein the first stage converter comprises:
a sample-and-hold circuit configured to sample the input analog signal according to a sampling signal;
a comparator configured to compare the sampled input analog signal based on a first stage feedback signal to output the first residue and a pre-output signal;
a SAR logic circuit configured to count the pre-output signal to generate the first output signal; and
a SAR DAC (Digital Analog Converter) configured to convert the first output signal within the first stage period to generate a first stage feedback signal.

6. The analog-to-digital converting apparatus of claim 1, wherein each second stage converter is a delta sigma (DS) converter, and wherein each second stage converter comprises:
a loop filter circuit configured to filter a signal obtained by combining the amplified first residue and the amplified second stage feedback signal;
a quantization circuit configured to digitally convert an output signal of the loop filter circuit;
a DS logic circuit configured to count an output of the quantization circuit to generate the second output signal; and
a DS DAC (Digital to Analog) configured to convert the output of the quantization circuit to output the second stage feedback signal.

7. A wireless communication device comprising the analog-to-digital converting apparatus of claim 1, the wireless communication device further comprising:
a low noise amplifier configured to amplify a radio frequency (RF) signal received through an antenna;
a mixer configured to down-convert the amplified RF signal to a baseband frequency range;
a low pass filter configured to filter the signal down-converted by the mixer; and
a digital signal processor configured to process the output digital signal;
wherein the analog-to-digital converting apparatus is configured to receive the input analog signal from the low pass filter and configured to convert the input analog signal into the output digital signal.

8. An analog-to-digital converting apparatus comprising:
a successive approximation register (SAR) converter configured to perform a first analog-to-digital signal conversion on an input analog signal during a first time period, and configured to output a first output signal and a first residue;
a first transmission circuit configured to amplify the first residue by a first gain;
a plurality of delta-sigma (DS) converters each configured to perform a second analog-to-digital conversion based on the amplified first residue based on a DS feedback signal during a second time period, and each configured to generate a respective second output signal, wherein each DS converter of the plurality of DS converters comprises a second transmission circuit configured to amplify the second output signal by the first gain to generate the DS feedback signal;
a plurality of first switches connected between the transmission circuit and a respective DS converter of the plurality of DS converters, each first switch configured to be controlled by an enable signal, and each first switch configured to transmit the amplified first residue to the respective DS converter in a time interleaved manner; and
a recombination logic circuit configured to combine the first output signal and the second output signals generated by the plurality of DS converters to output an output digital signal.

9. The analog-to-digital converting apparatus of claim 8, wherein each of the plurality of DS converters further comprises a second switch connected between the second transmission circuit of the DS converter and an input terminal of the DS converter and enabled according to an inverted enable signal.

10. The analog-to-digital converting apparatus of claim 9, wherein each of the plurality of DS converters comprises:
a loop filter circuit configured to filter a signal obtained by combining the first residue and the DS feedback signal;
a quantization circuit configured to perform a digital conversion on an output signal of the loop filter circuit;
a DS logic circuit configured to count an output of the quantization circuit to generate the second output signal; and
a Delta-Sigma Digital to Analog converter (DS DAC) configured to perform an analog conversion on an output of the quantization circuit to output the DS feedback signal.

11. The analog-to-digital converting apparatus of claim 8, wherein the enable signal is a signal set to an on value after the first period and before the second period.

12. The analog-to-digital converting apparatus of claim 8, wherein the first transmission circuit and the second transmission circuits are identical.

13. The analog-to-digital converting apparatus of claim 8, wherein the SAR converter comprises:
a sample-and-hold circuit configured to receive and sample the input analog signal;
a comparator configured to compare the sampled input analog signal based on a SAR feedback signal to output the first residue and a pre-output signal;
a SAR logic circuit configured to count the pre-output signal to generate the first output signal; and
a SAR DAC (Digital Analog Converter) configured to convert the first output signal within the first period to generate the SAR feedback signal.

14. An analog-to-digital converting apparatus comprising:
a plurality of open-loop converters each configured to convert an input analog signal, and configured to output a first output signal and a first residue from a first output terminal;
a first buffer connected to the first output terminal and configured to buffer the first residue;
at least one delta sigma (DS) converter configured to perform a delta-sigma conversion on the buffered first residue, and configured to output a second output signal and a DS feedback signal; and
a recombination logic circuit configured to combine the first output signal and the second output signal into an output digital signal,
wherein each of the at least one DS converters includes a second buffer configured to transmit the second output signal as the DS feedback signal.

15. The analog-to-digital converting apparatus of claim 14, further comprising:
a first switch connected between the first buffer and each DS converter of the at least one DS converter, wherein the first switch is controlled according to an enable signal, and wherein the first switch is configured to transmit the buffered first residue to the at least one DS converter in a time interleaved manner; and
a second switch connected between the second buffer and an input terminal of the at least one DS converter and controlled according to an inverted enable signal.

16. The analog-to-digital converting apparatus of claim 14, wherein the plurality of open-loop converters are connected in series,
wherein a first open-loop converter of the plurality of open-loop converters is configured to determine at least two or more bits and a previous stage residue down from upper bits, and a second open-loop converter of the plurality of open-loop converters connected to an output of the first open-loop converter is configured to determine at least two or more bits and a subsequent residue down from bits after the bits determined by the first open-loop converter, based on the previous residue, and
wherein the first output signal and the first residue are output from a last open-loop converter of the plurality of open-loop converters.

17. The analog-to-digital converting apparatus of claim 14, wherein the first buffer and each second buffer are source follower circuits.

18. The analog-to-digital converting apparatus of claim 14, wherein the at least one DS converter comprises a plurality of DS converters connected in parallel, and
wherein each of the DS converters is configured to output a second output signal generated by performing delta-sigma conversion based on the buffered first residue and the DS feedback signal.

* * * * *